(12) United States Patent
Eom et al.

(10) Patent No.: US 6,632,702 B2
(45) Date of Patent: Oct. 14, 2003

(54) COLOR IMAGE SENSOR AND METHOD FOR FABRICATING THE SAME

(75) Inventors: Jae-Won Eom, Ichon-shi (KR); Do-Young Lee, Ichon-shi (KR); Kang-Jin Lee, Ichon-shi (KR); Chan-Ki Kim, Ichon-shi (KR); Ki-Nam Park, Ichon-shi (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 10/091,409

(22) Filed: Mar. 7, 2002

(65) Prior Publication Data

US 2002/0096696 A1 Jul. 25, 2002

Related U.S. Application Data

(62) Division of application No. 09/461,717, filed on Dec. 16, 1999, now Pat. No. 6,359,323.

(30) Foreign Application Priority Data

Dec. 30, 1998 (KR) .............................................. 98-61126

(51) Int. Cl.[7] .............................................. H01L 21/00
(52) U.S. Cl. ........................................................ 438/73
(58) Field of Search .............................. 438/73, 75, 87, 438/57, 59–60, 511, 515, 522, 800

(56) References Cited

U.S. PATENT DOCUMENTS 5,977,576 A * 11/1999 Hamasaki .................... 257/292

* cited by examiner

Primary Examiner—Craig Thompson
(74) Attorney, Agent, or Firm—Jacobson Holman PLLC

(57) ABSTRACT

A method for fabricating a color image sensor for scanning and converting an optical image into electrical signals, includes the steps of: (a) forming a P-type semiconductor layer on a substrate; (b) forming field oxide layers on the P-type semiconductor layer to define regions for red, green and blue photodiodes; (c) providing an ion implantation mask having different mask patterns for the red, the green and the blue photodiodes; (d) implanting impurity ions into the P-type semiconductor layer through the use of said ion implantation mask to form N-type diffusion regions in the P-type semiconductor layer; and (e) applying a thermal process to the resulting structure to form different first, second and third depletion regions corresponding to the red, the green and the blue photodiodes.

8 Claims, 7 Drawing Sheets

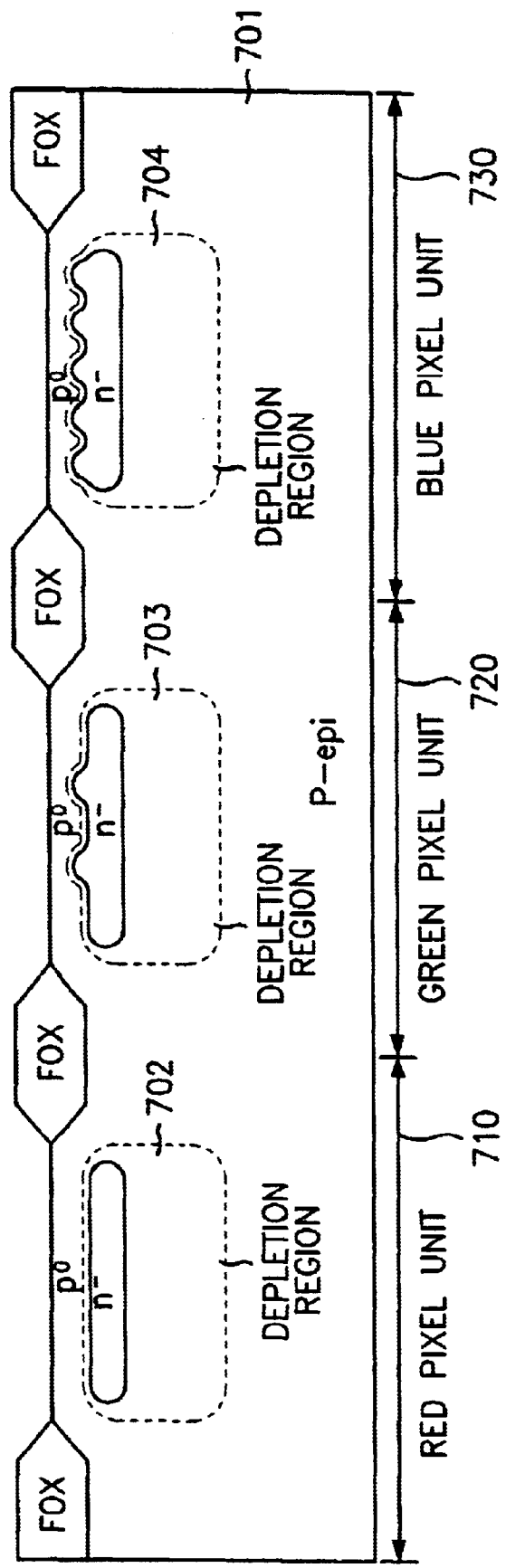

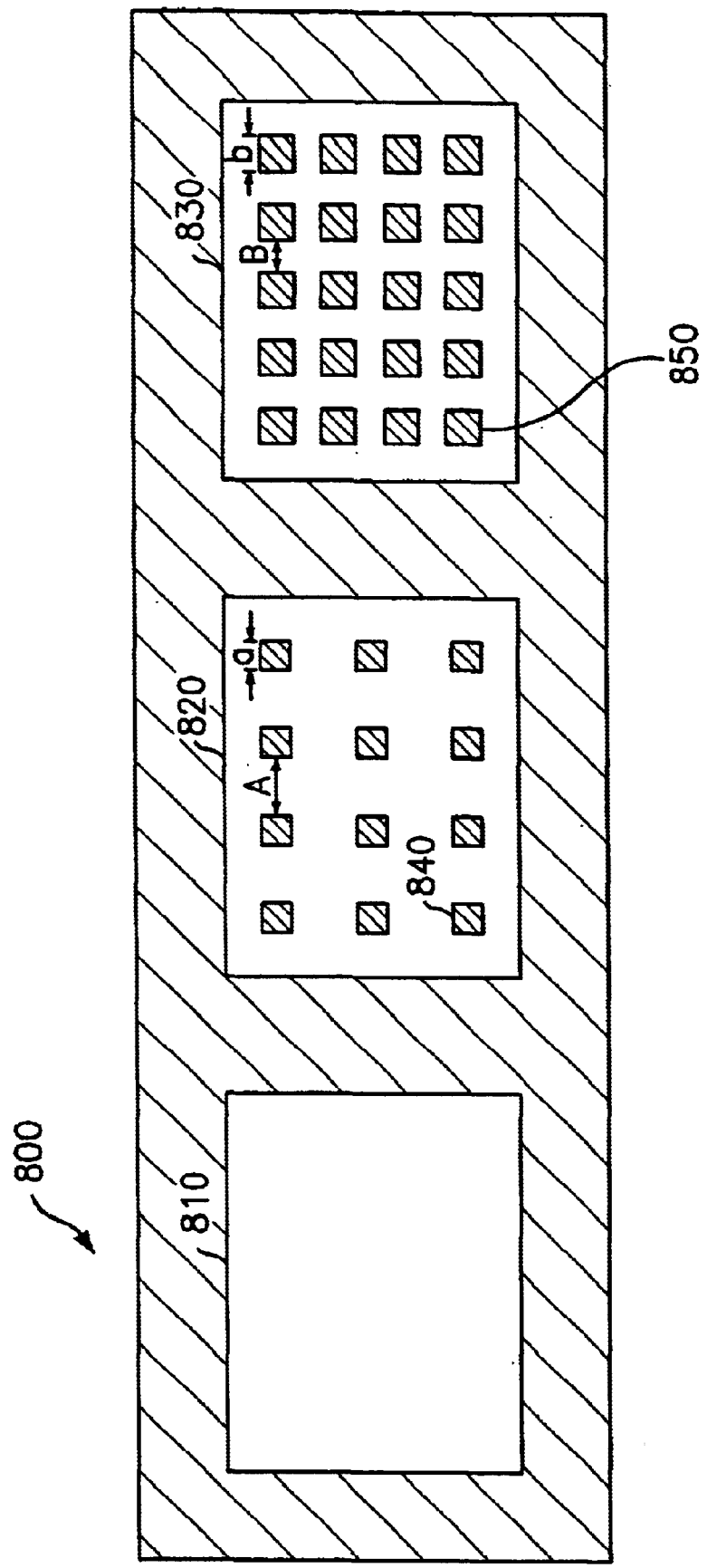

COLOR IMAGE SENSOR AND METHOD FOR FABRICATING THE SAME

This application is a divisional application of U.S. application Ser. No. 09/461,717, filed on Dec. 16, 1999; now U.S. Pat. No. 6,359,323 which claims priority from Korean Application No. 1998-61126, filed Dec. 30, 1998.

FIELD OF THE INVENTION

The present invention relates to an image sensor; and, more particularly, to a color image sensor and a method for fabricating the same.

DESCRIPTION OF THE PRIOR ART

Generally, an image sensor, e.g., a CCD (charge coupled device) image sensor or a CMOS (complementary metal oxide semiconductor) image sensor is employed to scan and convert an optical image into electrical signals.

Referring to FIG. 1, there is shown a pixel unit of a conventional image sensor including a photodiode (PD) and four NMOS transistors.

The four NMOS transistors include a transfer transistor 12, a reset transistor 14, a drive transistor 16 and a select transistor 18. The transfer transistor 12 transfers photoelectric charges generated in the photodiode to a sensing node. The reset transistor 14 resets the sensing node in order to sense a next signal. The drive transistor 16 acts as a source follower. The select transistor 18 outputs data to an output terminal OUT in response to an address signal. A load transistor 20, which is positioned between the output terminal OUT of the pixel unit and the ground voltage level, receives a biasing signal from an external device for the sake of biasing the pixel unit. A capacitance of a floating diffusion is referred to as "Cfd".

Referring to FIG. 2, there is shown the photodiode of the pixel unit in FIG. 1. The photodiode includes a P$^+$ silicon substrate 21, a P-epi (epitaxial) layer 22, field oxide layers 23, an N$^-$ diffusion region 24 and a P$^0$ diffusion region 25. The photodiode (PD) has a PNP junction structure in which the P-epi 22, the N$^-$ diffusion region 24 and the P$^0$ diffusion region 25 are stacked.

Referring to FIG. 3, a conventional color image sensor includes pixel units and each pixel unit includes a photodiode. Photodiodes 102a, 102b and 102c are formed in the color image sensor. Non-photosensing regions 103 are formed between photodiodes 102a, 102b and 102c. An interlayer insulating layer 105a is formed on the photodiodes 102a, 102b and 102c and the non-photosensing regions 103. Light shield layers 104 is formed on the interlayer insulating layer 105a to shield light incident on the non-photosensing regions 103. An interlayer insulating layer 105b is formed on the light shield layers 104. Red, green and blue filters 106a, 106b and 106c are formed on the interlayer insulating layer 105b. A buffer layer 107 is formed on the color filters 106a, 106b and 106c to improve the planarization of upper portions of the color filters 106a, 106b and 106c and the transitivity of light. Micro lenses 108a, 108b and 108c are formed on the buffer layer 107.

The photodiode 102a receives light from an object and integrates photoelectric charges from the light via the micro lens 108a and the red filter 106a. The photodiode 102b receives the light of the object and integrates the photoelectric charges from the light via the micro lens 108b and the green filter 106b. The photodiode 102c receives the light of the object and integrates the photoelectric charges from the light through the micro lens 108c and the blue filter 106c. The pixel units consist of red, green and blue pixel units to output color signals of red, green and blue components of the light from the object. Conventionally, the red, green and blue pixel units are formed by the same fabrication process, respectively, so that the photodiodes 102a, 102b and 102c of the red, green and blue pixel units have substantially the same depletion region structure each other. Accordingly, there is a problem that the conventional color image sensor having photodiodes of the same depletion region structure may not improve light sensitivity since it is variable according to wavelengths of the red, green and blue components of the light.

Referring to FIG. 4, a graph depicts the absorption length of a light wavelength in Si, GaAs and Ge mediums when light is incident on a medium. The light wavelength of 770 nm is absorbed up to the absorption length of 7 $\mu$m in the Si medium while the light wavelength of 390 nm is absorbed up to the absorption length of 0.1 $\mu$m in the Si medium. Therefore, the light sensitivity of a photodiode depends on a kind of medium and wavelengths of red, green and blue components of light.

Referring to FIG. 5, a graph depicts light sensing characteristics of the conventional color image sensor in FIG. 3. The photodiode of the color image sensor receives light from an object. The light includes red, green and blue components, which have a different wavelength from each other. The red component has the longest wavelength among the red, green and blue components. The green component has a wavelength longer than the blue component. Since the blue component has a wavelength shorter than the red or green component, a part of the blue component is lost before the blue component reaches the depletion region. Accordingly, the photodiode have low light sensitivity of the blue component. Also, when a red pixel unit reaches a saturation state, a blue pixel unit does not reach the saturation state. Furthermore, when an image process is performed on the basis of color signals from the red pixel unit, color signals from the green and blue pixel units can be lost, so that colors represented by the conventional image sensor are limited and a dynamic range for the sake of processing data is reduced. In other words, color signals from the red, green and blue pixel units may display different colors from actual colors of an object because the red, green and blue pixel units have different light sensing characteristics from each other.

SUMMARY OF THE INVENTION

It is, therefore, an object of the present invention to provide a color image sensor in which a plurality of photodiodes have a different depletion region structure from each other to improve light sensitivity for various color components of light from an object.

It is another object of the present invention to provide a method for fabricating a color image sensor in which a plurality of photodiodes have a different depletion region structure from each other to improve light sensitivity for various color components of light from an object.

In accordance with an aspect of the present invention, there is provided a color image sensor for scanning and converting an optical image into electrical signals, comprising: a red photodiode including a P-type semiconductor layer and a first N-type diffusion region located beneath the surface of the P-type semiconductor layer to thereby form a first depletion region positioned beneath the surface of the P-type semiconductor layer; a green photodiode including the P-type semiconductor layer and a second N-type diffusion region located beneath the surface of the P-type semiconductor layer to thereby form a second depletion region positioned beneath the surface of the P-type semiconductor layer, wherein the second depletion region is more adjacent to the surface of the P-type semiconductor layer than the first depletion region; and a blue photodiode including the P-type semiconductor layer and a third N-type diffusion region located beneath the surface of the P-type semiconductor layer to thereby form a third depletion region positioned beneath the surface of the P-type semiconductor layer, wherein the third depletion region is more adjacent to the surface of the P-type semiconductor layer than the second depletion region.

In accordance with another aspect of the present invention, there is provided a method for fabricating a color image sensor for scanning and converting an optical image into electrical signals, comprising the steps of: (a) forming a P-type semiconductor layer on a substrate; (b) forming field oxide layers on the P-type semiconductor layer to define regions for red, green and blue photodiodes; (c) providing an ion implantation mask having different mask patterns for the red, the green and the blue photodiodes; (d) implanting impurity ions into the P-type semiconductor layer through the use of said ion implantation mask to form N-type diffusion regions in the P-type semiconductor layer; and (e) applying a thermal process to the resulting structure to form different first, second and third depletion regions corresponding to the red, the green and the blue photodiodes.

BRIEF DESCRIPTION OF THE DRAWINGS

Other objects and aspects of the invention will become apparent from the following description of the embodiments with reference to the accompanying drawings, in which:

FIG. 6 is a cross-sectional view describing photodiodes of a color image sensor in accordance with the present invention; and FIGS. 7A and 7B are top views describing ion implantation masks to the photodiodes of FIG. 6.

DETAILED DESCRIPTION OF THE INVENTION

Figure 1:
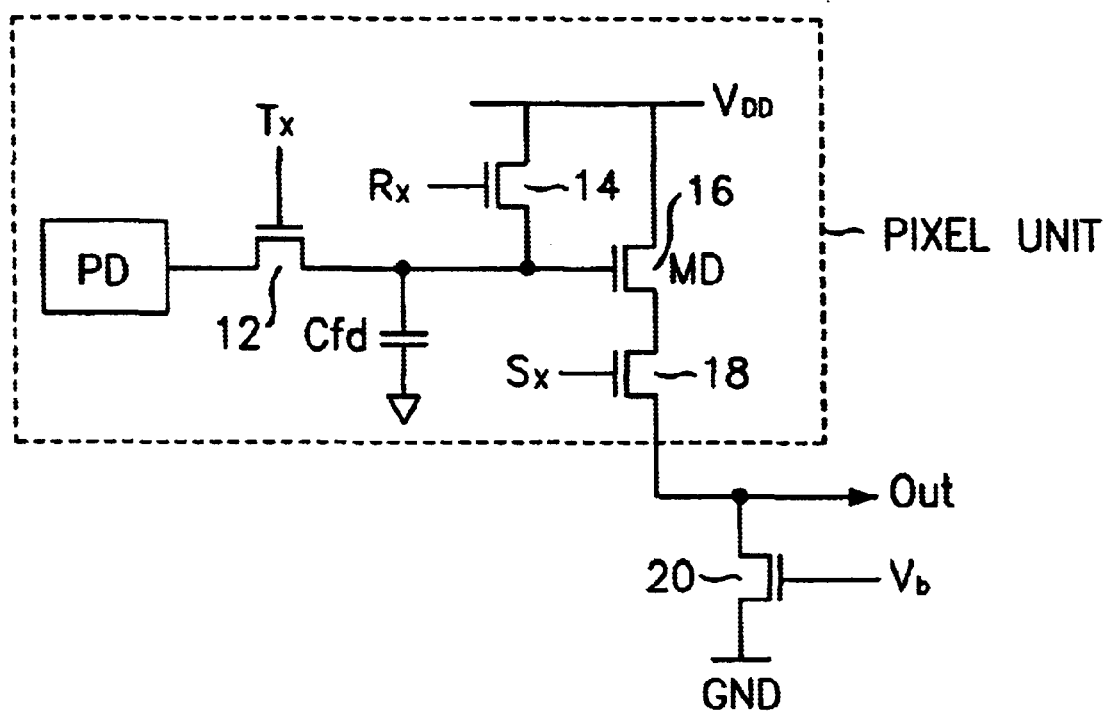
FIG. 1 is a circuit diagram showing a pixel unit of a conventional image sensor.
Figure 2:
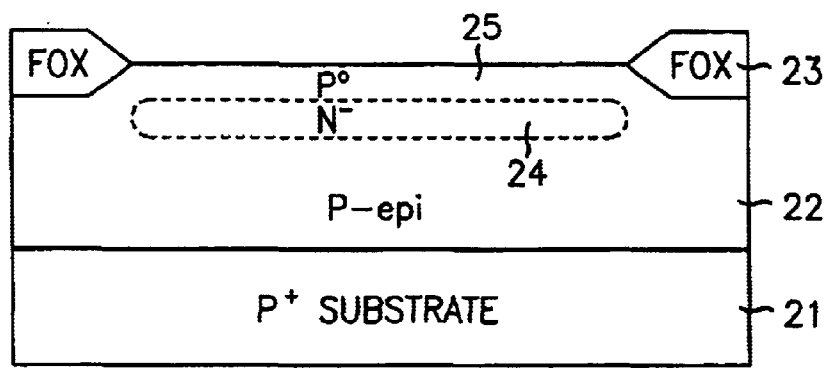
FIG. 2 is a cross-sectional view describing the photodiode in FIG. 1.
Figure 3:
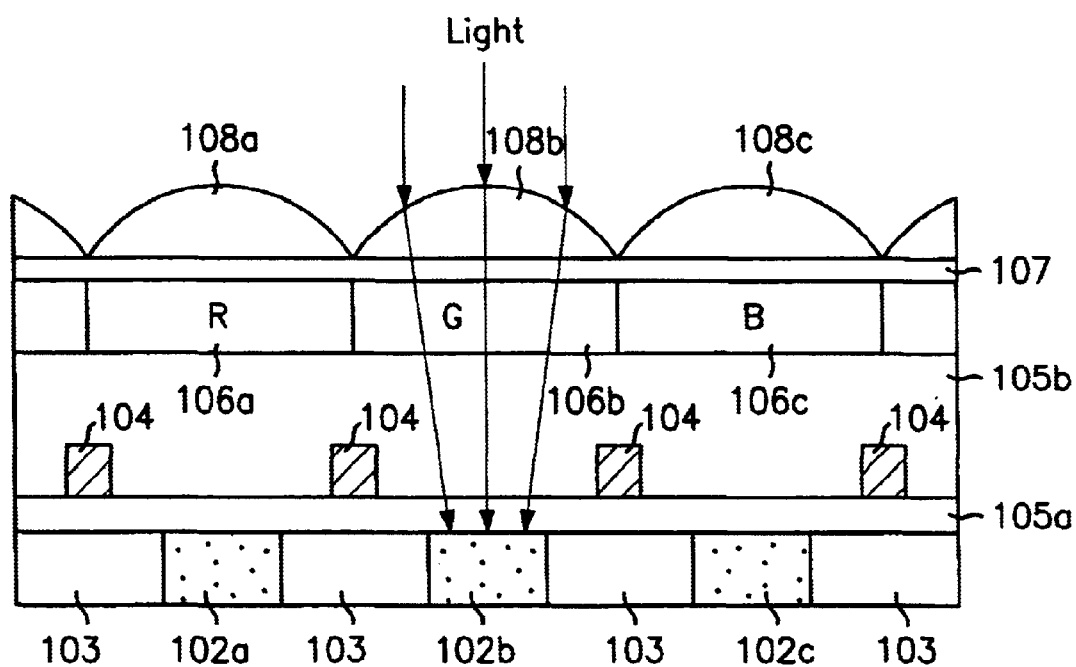
FIG. 3 is a cross-sectional view describing a conventional color image sensor.
Figure 4:
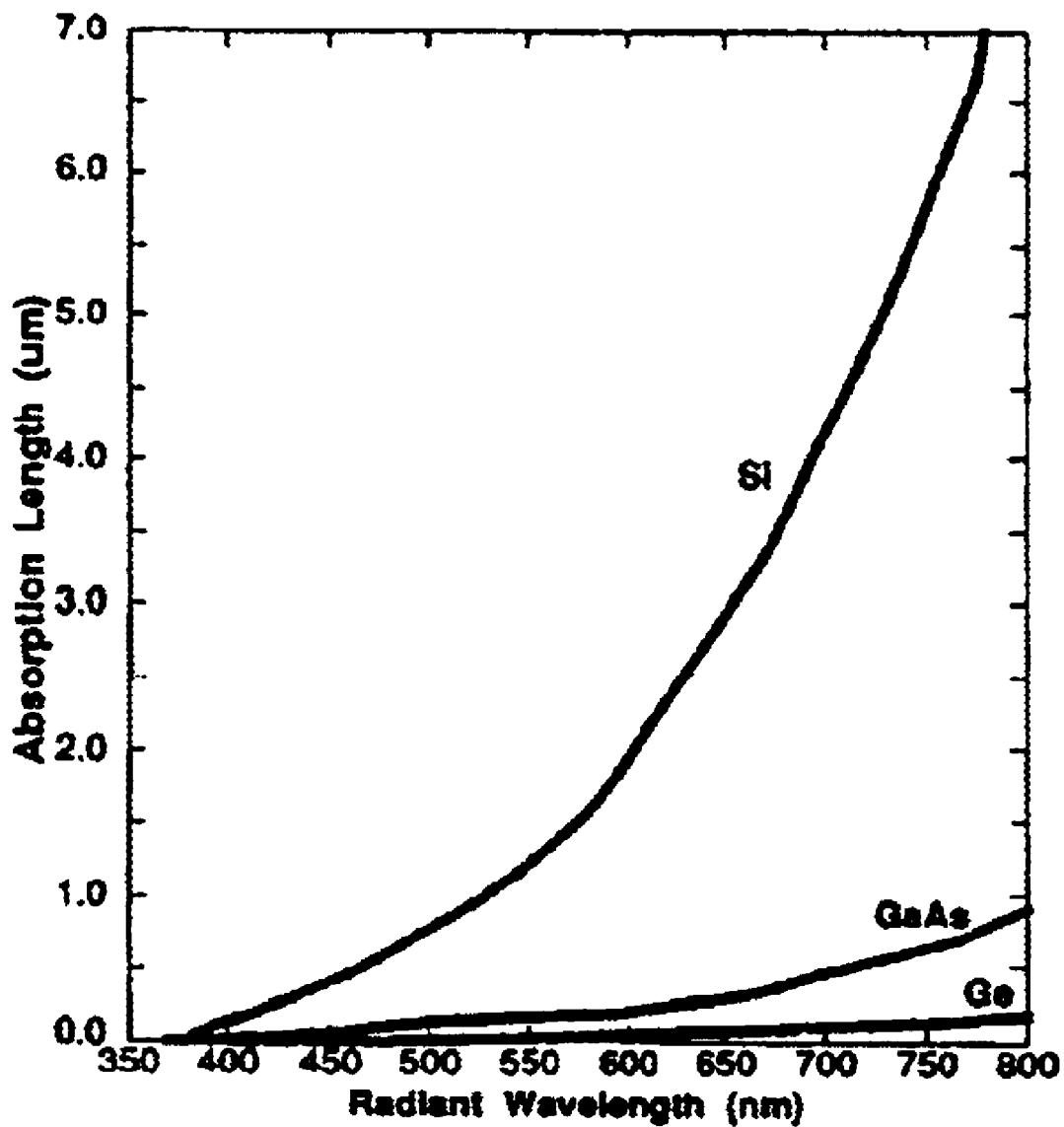
FIG. 4 is a graph depicting absorption length corresponding to a wavelength in various mediums.
Figure 5:
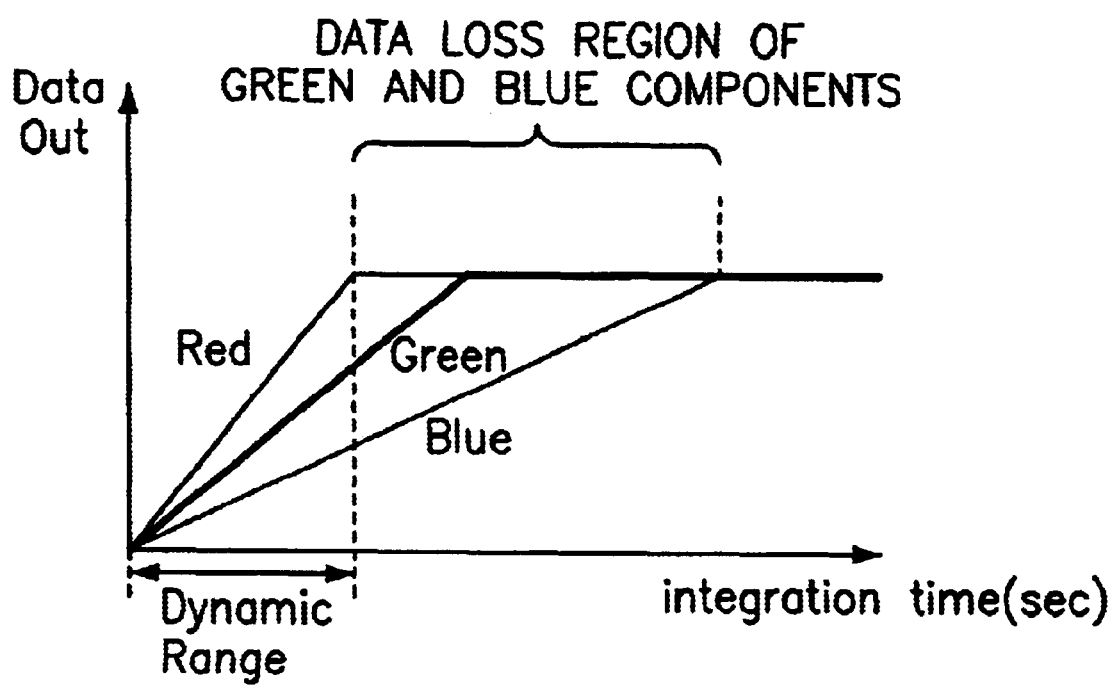
FIG. 5 is a graph depicting light sensing characteristics of the conventional color image sensor in FIG. 3.

Referring to FIG. 6, it will be understood that photodiodes of red, green and blue pixel units have a different depletion region structure from each other to improve light sensitivity for various color components of light from an object.

A photodiode of the red pixel unit 710 receives a red component of light and generates photoelectric charges from the red component of the light. The photodiode of the red pixel unit 710 has a depletion region 702 adjacent to the surface of a P-epi layer 701.

A photodiode of a green pixel unit 720 receives a green component of light and generates photoelectric charges from the green component of the light. Since the green component has a wavelength shorter than the red component, the photodiode of the green pixel unit 720 has a depletion region 703 more adjacent to the surface of the P-epi layer 701 than that of the red pixel unit 710.

A photodiode of a blue pixel unit 730 receives a blue component of light and generates photoelectric charges from the blue component of the light. Since the blue component has a wavelength shorter than the green component, the photodiode of the blue pixel unit 730 has a depletion region 704 more adjacent to the surface of the P-epi layer 701 than that of the green pixel unit 720.

The photodiodes of the red, green and blue pixel units 710, 720 and 730 each has the lightly doped P-epi layer 701, an $N^-$ diffusion region formed in the P-epi layer 701, and a $P^0$ diffusion region formed between the surface of the P-epi layer 701 and the $N^-$ diffusion region.

The color image sensor in accordance with the present invention controls the distance between the surface of the P-epi layer and the $N^-$ diffusion region to compensate characteristic difference between pixel units. For example, in the photodiode of the blue pixel unit receiving the blue component with the shortest wavelength, the depletion region of the blue pixel unit is more adjacent to the surface of the P-epi layer than that of the red and green pixel units. Although the blue component has the shortest wavelength, since the depletion region of the photodiode in the blue pixel unit is more adjacent to the surface of the P-epi layer than that in the red and green pixel units, the blue component can sufficiently reach the depletion region and the photodiode of the blue pixel unit can improve the light sensitivity of the blue component.

One ion implantation mask is employed to control a distance between the surface of the P-epi layer and the $N^-$ diffusion region, that is, to control an impurity ion concentration implanted into the depletion region. The ion implantation mask has different mask patterns for the red, green and blue pixels. Accordingly, when impurity ions are implanted in the P-epi layer over the ion implantation mask, an impurity ion concentration depends on the mask patterns of the red, green and blue pixel units.

Figure 7B:
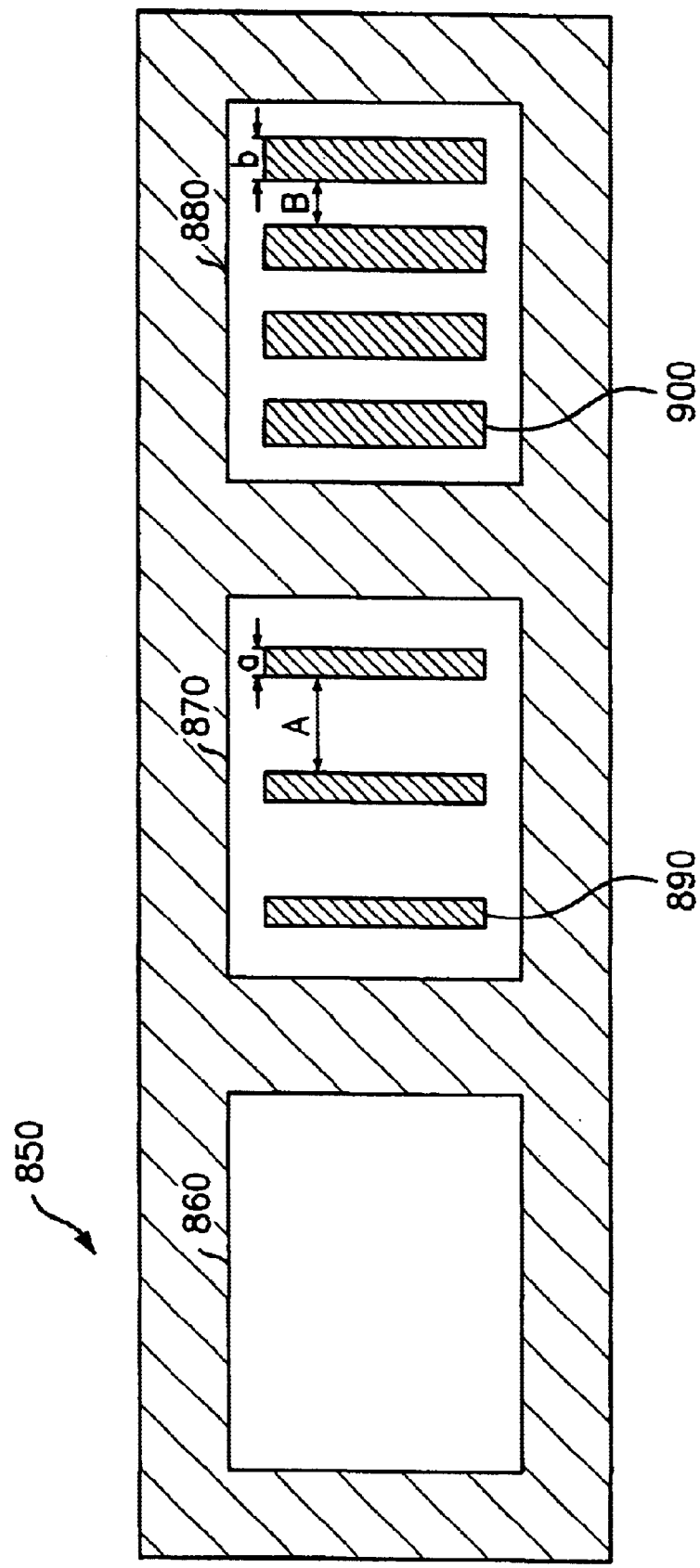

Referring to FIGS. 7A and 7B, top views of ion implantation masks 800 and 850 are employed to control the impurity ion concentration implanted into the depletion region. The ion implantation masks 800 and 850 include mask regions 810, 820, 830, 860, 870 and 880 for the red, green and blue pixel units. The ion implantation masks 800 and 850 include screening patterns to control an impurity ion concentration. The mask region 810 for a red pixel unit has not a screening pattern. The mask regions 820 and 830 for the green and blue pixel units have the screening patterns 840 and 850 of a square type. The mask regions 870 and 880 for the green and blue pixel units have the screening patterns 890 and 900 of a rectangular type. The number of the screening patterns 850 of the mask region 830 is more than that of the screening patterns 840 of the mask region 820. Similarly, the number of the screening patterns 900 of the mask region 880 is more than that of the screening patterns 890 of the mask region 870. Preferably, the distance "A" between two screening patterns for the green pixel unit is longer than the distance "B" between two screening patterns for the blue pixel unit. Also, the size "a" of each screening pattern for the green pixel unit is greater than the size "b" of each screening pattern for the blue pixel unit.

After the ion implantation over the ion implantation mask, a thermal process is applied to the resulting structure. At this time, an uneven portion of the depletion region is formed closely with the surface of a P-epi layer in the photodiodes of the green and blue pixel units. The present invention can be applied to a PN junction photodiode as well as a PNP junction photodiode. Also, the color image sensor in accordance with the present invention can be fabricated by using the conventional fabrication process except for the ion implantation mask different from a conventional ion implantation mask.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating a color image sensor for scanning and converting an optical image into electrical signals, comprising the steps of:
    (a) forming a first conductive type semiconductor layer on a substrate;
    (b) forming field oxide layers on the first conductive type semiconductor layer to define regions for red, green and blue photodiodes;
    (c) providing an ion implantation mask having different mask patterns for the red, the green and the blue photodiodes;
    (d) implanting impurity ions into the first conductive type semiconductor layer through the use of said ion implantation mask to form second conductive type diffusion regions in the first conductive type semiconductor layer; and
    (e) applying a thermal process to the resulting structure to form different first, second and third depletion regions corresponding to the red, the green and the blue photodiodes, respectively, wherein the second depletion region is more adjacent to the surface of the semiconductor layer than the first depletion region and the third depletion region is more adjacent to the surface of the semiconductor layer than the second depletion region.

2. The method as recited in claim 1, wherein the ion implantation mask includes:
    a first mask region for forming a first diffusion region;
    a second mask region for forming a second diffusion region, the second mask region having a plurality of first screening patterns to thereby reduce an impurity ion concentration; and
    a third mask region for forming a third diffusion region, the third mask region having a number of second screening patterns to thereby reduce an impurity ion concentration more than the second mask region.

3. The method as recited in claim 2, wherein the shape of the second screening patterns is identical to that of the first screening patterns and the number of the second screening patterns is more than that of the first screening patterns.

4. The method as recited in claim 2, wherein the first and second screening patterns are square shaped.

5. The method as recited in claim 2, wherein the first and second screening patterns are rectangular shaped.

6. The method as recited in claim 2, wherein the first and second screening patterns are stripe shaped.

7. The method as recited in claim 1, wherein the first conductive type is P-type.

8. The method as recited in claim 7, wherein the second conductive type is N-type.

* * * * *